(12) United States Patent
Ye

(10) Patent No.: US 10,971,587 B2
(45) Date of Patent: Apr. 6, 2021

(54) GAN LATERAL VERTICAL JFET WITH REGROWN CHANNEL AND DIELECTRIC GATE

(71) Applicant: Gangfeng Ye, Fremont, CA (US)

(72) Inventor: Gangfeng Ye, Fremont, CA (US)

(73) Assignee: Gangfeng Ye, Fremont, CA (US)

( * ) Notice: Subject to any disclaimer, the term of this patent is extended or adjusted under 35 U.S.C. 154(b) by 0 days.

(21) Appl. No.: 16/705,833

(22) Filed: Dec. 6, 2019

(65) Prior Publication Data

US 2020/0111878 A1 Apr. 9, 2020

Related U.S. Application Data

(63) Continuation of application No. 15/882,040, filed on Jan. 29, 2018, now Pat. No. 10,535,741.

(Continued)

(51) Int. Cl.
| | |
|---|---|
| *H01L 29/20* | (2006.01) |
| *H01L 29/66* | (2006.01) |
| *H01L 29/10* | (2006.01) |
| *H01L 29/78* | (2006.01) |
| *H01L 29/808* | (2006.01) |
| *H01L 29/08* | (2006.01) |
| *H01L 29/417* | (2006.01) |
| *H01L 29/778* | (2006.01) |

(52) U.S. Cl.
CPC ...... *H01L 29/2003* (2013.01); *H01L 29/0847* (2013.01); *H01L 29/1058* (2013.01); *H01L 29/41766* (2013.01); *H01L 29/66462* (2013.01); *H01L 29/66666* (2013.01); *H01L 29/66916* (2013.01); *H01L 29/7788* (2013.01); *H01L 29/7827* (2013.01); *H01L 29/8083* (2013.01)

(58) Field of Classification Search
CPC .......... H01L 29/2003; H01L 29/41766; H01L 29/0847; H01L 29/7788; H01L 29/66462; H01L 29/8083; H01L 29/66916; H01L 29/66666; H01L 29/1058; H01L 29/7827
See application file for complete search history.

(56) References Cited

U.S. PATENT DOCUMENTS 7,064,407 B1 * 6/2006 Mallikarjunaswamy .................... H01L 27/0727 257/287
7,638,379 B2 * 12/2009 Cheng ................. H01L 29/0619 257/E21.421

(Continued)

*Primary Examiner* — Earl N Taylor
(74) *Attorney, Agent, or Firm* — Helen Mao; Imperium Patent Works

(57) ABSTRACT

A vertical JFET is provided. The JFET is mixed with lateral channel structure and p-GaN gate structure. The JFET has a N+ implant source region. In one embodiment, a JFET is provided with a drain metal deposited over a backside of an N substrate, an n-type drift layer epitaxial grown over a topside of the N substrate, a buried P-type block layer deposited over the n-type drift layer, an implanted N+ source region on side walls of the lateral channel layer, and an source metal attached to the top of the p-layer and attached to the implanted N+ source region at the side. In one embodiment, the JFET further comprises a gate layer, and wherein the gate layer is a dielectric gate structure that enables a fully enhanced channel. In another embodiment, the gate layer is a p-type GaN gate structure that enables a partially enhanced channel.

8 Claims, 4 Drawing Sheets

Related U.S. Application Data

(60) Provisional application No. 62/451,718, filed on Jan. 28, 2017.

(56) References Cited

U.S. PATENT DOCUMENTS

| | | | | |
|---|---|---|---|---|
| 8,193,537 B2* | 6/2012 | Mazzola | ............ | H01L 31/1105 257/77 |
| 8,455,328 B2* | 6/2013 | Mazzola | ............... | H03K 17/78 438/403 |
| 8,853,710 B2* | 10/2014 | Mazzola | ............ | H01L 31/1105 257/77 |
| 9,368,582 B2* | 6/2016 | Kizilyalli | .......... | H01L 21/02634 |
| 10,062,693 B2* | 8/2018 | Ando | .............. | H01L 21/823807 |
| 10,347,736 B2* | 7/2019 | Kizilyalli | .......... | H01L 21/02433 |
| 2005/0067630 A1* | 3/2005 | Zhao | ................... | H01L 29/8083 257/134 |
| 2007/0029573 A1* | 2/2007 | Cheng | ................ | H01L 29/0619 257/135 |
| 2007/0292074 A1* | 12/2007 | Mazzola | ............... | H01L 31/028 385/14 |
| 2008/0124853 A1* | 5/2008 | Cheng | ................. | H01L 29/0619 438/193 |
| 2008/0197442 A1* | 8/2008 | Hirler | ................ | H01L 29/7397 257/496 |
| 2012/0214275 A1* | 8/2012 | Mazzola | ................. | H01L 31/09 438/93 |
| 2013/0320199 A1* | 12/2013 | Mazzola | ............ | H01L 31/1105 250/214 SW |
| 2014/0145201 A1* | 5/2014 | Nie | .................... | H01L 29/8083 257/76 |
| 2014/0191242 A1* | 7/2014 | Nie | .................. | H01L 29/66431 257/76 |
| 2015/0123138 A1* | 5/2015 | Kizilyalli | ............ | H01L 29/8613 257/76 |
| 2017/0133481 A1* | 5/2017 | Kizilyalli | ............ | H01L 21/0254 |
| 2018/0166556 A1* | 6/2018 | Kizilyalli | .............. | H01L 29/861 |
| 2018/0219071 A1* | 8/2018 | Ye | ........................ | H01L 29/205 |
| 2018/0219072 A1* | 8/2018 | Ye | ..................... | H01L 29/66462 |

\* cited by examiner

GAN LATERAL VERTICAL JFET WITH REGROWN CHANNEL AND DIELECTRIC GATE

CROSS REFERENCE TO RELATED APPLICATIONS

This application is a continuation, and claims priority under claims priority under 35 U.S.C. § 120 from nonprovisional U.S. patent application Ser. No. 15/882,040, entitled "GaN LATERAL VERTICAL JFET WITH REGROWN CHANNEL AND DIELECTRIC GATE," filed on Jan. 29, 2018, the subject matter of which is incorporated herein by reference. Application Ser. No. 15/882,040, in turn claims priority under 35 U.S.C. § 119 from U.S. Provisional Application No. 62/451,718 entitled "GaN LATERAL VERTICAL JFET WITH REGROWN CHANNEL AND DIELECTRIC GATE," filed on Jan. 28, 2017, the subject matter of which is incorporated herein by reference.

TECHNICAL FIELD

The present invention relates generally to semiconductor devices, in particular to GaN Lateral Vertical junction field effect transistor (JFET) with source-P Block contact.

BACKGROUND

Significant progress has been made in the research and development of next generation semiconductor devices. JFET is promising for high power and high temperature applications. Vertical JFET on bulk GaN with vertical drift region has been demonstrated. However, there are several issues. One issue is that source and p-type block layer typically not Ohmic. It would affect switch behavior and long-term reliability. The second issue is that regrowth of lateral and vertical channel often is high resistive due to counter doping during the regrowth. The third one is the source contact with the lateral channel needs to be enhanced.

These issues affect the reliability of the JFET. Improvement and enhancement are desired for JFET for an improved Ohmic contact, less resistive lateral channel layer, and better source contact with the lateral channel layer.

SUMMARY

In one novel aspect, a vertical JFET is provided, which mixed with lateral channel structure, with p-GaN gate structure, improved barrier layer for p-GaN block layer and enhanced Ohmic contact with source. In one embodiment, regrowth of lateral channel is provided so that counter doping surface Mg will be buried. In another embodiment, a dielectric layer is provided to protect p-type block layer during the processing, and later make Ohmic source and p-type block layer.

In one novel aspect, a JFET is provided with a drain metal deposited over a backside of an N substrate, an n-type drift layer epitaxial grown over a topside of the N substrate, a buried P-type block layer deposited over the n-type drift layer, wherein the buried P-type block layer has cut through trenches, an implanted N+ source region on side walls of the lateral channel layer, and an N+ source metal attached to the top of the p-layer and attached to the implanted N+ source region at the side. In one embodiment, the first regrown N-type layer is an anti-p-doping layer. The second regrown layer is an aluminum gallium nitride (AlGaN)/gallium nitride (GaN) layer. In one embodiment, the JFET further comprises a gate layer over the lateral channel layer. In one embodiment, the gate layer is a dielectric gate structure that enables a fully enhanced channel. In another embodiment, the gate layer is a p-type GaN gate structure that enables a partially enhanced channel.

In another novel aspect, method of a barrier regrown layer for enhanced lateral channel performance is provided. A process comprises as-growing epitaxial layers on top of a N+ gallium nitride (GaN) substrate, wherein an N-type GaN drift layer is grown over the N+ substrate layer, and a P-type block layer is grown over the N-type GaN drift layer, re-growing a first N-type regrown layer over the P-type block layer, wherein the first N-type regrown layer encapsulates the P-type block layer and surface dopant, etching trenches through the first N-type regrown layer and the P-type block layer, and re-growing a second regrown layer over the first N-type regrown layer and in the trench to form an N-type channel and an AlGaN/GaN 2D Gas channel. In one embodiment, the first regrown N-type layer is an anti-p-doping layer.

In yet another novel aspect, method of a patterned regrowth for enhanced Ohmic contact is provided. A process comprises as-growing epitaxial layers on top of a N+ GaN substrate, wherein an N-type GaN drift layer is grown over the N+ substrate layer, and a P-type block layer is grown over the N-type GaN drift layer, and re-growing one or more regrown layers over the P-type block layer with a patterned regrown.

In one novel aspect, method of N+ implant source region for the JFET is provided. A process comprises as-growing epitaxial layers on top of a N+ GaN substrate, wherein an N-type GaN drift layer is grown over the N+ substrate layer, and a P-type block layer is grown over the N-type GaN drift layer, re-growing a lateral channel layer over the P-type block layer, wherein a contact gap is formed in the lateral channel layer with side walls, implanting N+ on the side walls of the lateral channel to form a source region, and depositing N+ source metal in the contact gap and over a part of the lateral channel layer such that the N+ source metal attached to the top of the p-layer and attached to the implanted N+ source region at the side.

Other embodiments and advantages are described in the detailed description below. This summary does not purport to define the invention. The invention is defined by the claims.

BRIEF DESCRIPTION OF THE DRAWINGS

The accompanying drawings, where like numerals indicate like components, illustrate embodiments of the invention.

DETAILED DESCRIPTION

Reference will now be made in detail to some embodiments of the invention, examples of which are illustrated in the accompanying drawings.

Figure 1:
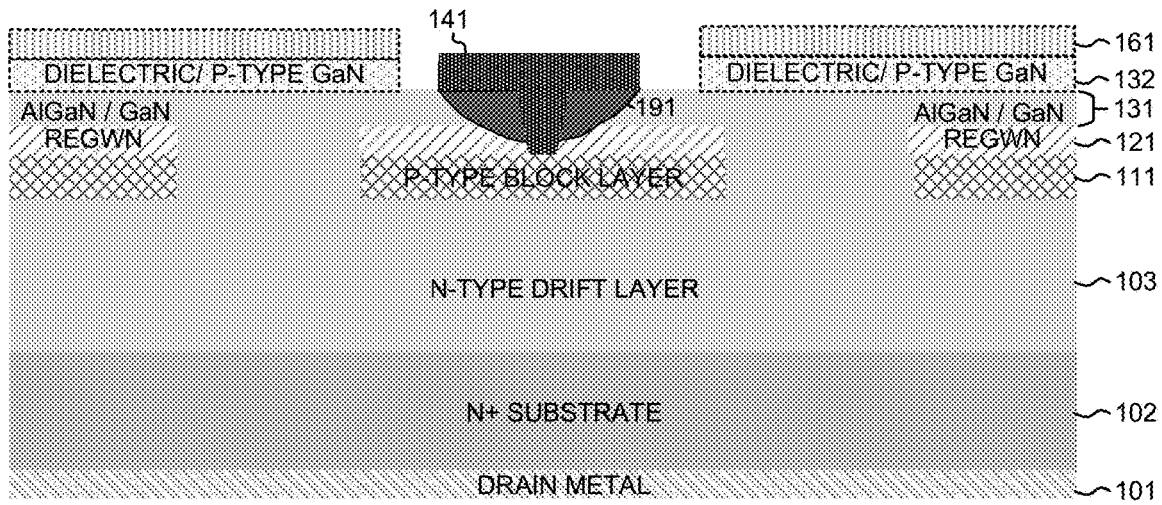
FIG. 1 is simplified exemplary cross-sectional diagram of a lateral vertical HJFET with source-P block contact and side contact implant in accordance with embodiments of the current invention.

FIG. 1 is simplified exemplary cross-sectional diagram of a lateral vertical HJFET with source-P block contact and side contact implant in accordance with embodiments of the current invention. The vertical HJFET has a drain metal 101 attached to the backside of a substrate 102. In one embodiment, substrate 102 is an N+ substrate. In one embodiment, substrate 102 has a dimensional height in the range of 50-100 μm thinning. In another embodiment, substrate 102 has a dimensional height in the range of less than 300 μm. An N-type drift layer 103 deposited over substrate 102. In one embodiment, N-type drift layer 103 is an N-type gallium nitride (GaN) drift layer. In one embodiment substrate 102 and drift layer 103 are epitaxially as-grown. Drift layer 103 has a dimensional height in the range of 6-20 μm. In one embodiment, drift layer 103 has a height around 2 μm for possible low voltage punch through devices. In another embodiment, drift layer 103 has a height around 40 μm for high voltage punch through devices. A P-type block layer 111 is deposited over N-type drift layer 103. P-type block layer 111 is atop drift layer 103. P-type block layer 111 is trenched with trench regions. P-type block layer is doped with p to form a block layer.

In one novel aspect, a regrown barrier layer 121 is deposited over P-type block layer 103. In the traditional JFET, the regrowth of the lateral layer and the vertical channel is high resistive due to the counter doping during the regrowth. During the regrowth, drift layer spills over to the regrown layer resulting in counter doping in the regrown layer. In one embodiment, regrown layer 121 is an anti-p-doping layer that blocks the counter doping to the lateral layer and the vertical channel. Regrown layer 121 buries counter doping surface magnesium (Mg) in the regrown layer 121 so the lateral channel is less resistive. A lateral layer 131 is deposited over the regrown layer 121. In one embodiment, lateral layer 131 is formed by regrowth in the trenches of p-layer 111 and on top of regrown layer 121. Lateral layer 131 forms n-type channel and an AlGaN/GaN 2D Gas channel. A top gate layer 132 is deposited over the lateral layer 131. In one embodiment, gate layer 132 is a dielectric gate structure that enables a fully enhanced channel. In another embodiment, gate layer 132 is a p-type GaN gate structure that enables a partially enhanced channel. In yet another embodiment, gate layer 132 can be other variations known to one ordinary skills in the art. A gate metal layer 161 is deposited over gate layer 132. A source gate 141 is deposited over the top surface of p-type block layer 103 and side walls lateral channel layer 131. In one embodiment, source gate 141 is metal and alloy. In one embodiment, Source metal 141 is formed to attach to the top surface of P-type block layer 103 through a contact gap created during the re-grown process.

In one novel aspect, contact gap to the top surface of p-type block 103 is created using patterned regrowth instead of the traditional etching process. In one embodiment, an island dielectric layer is deposited as regrowth mask before the regrown process. The contact gap is later created by etching the dielectric material after regrown the lateral channel layer. The result is source metal 141 has an enhanced Ohmic contact with the p-type block layer 103.

In yet another novel aspect, a source region 191 is created by implanting N+ on the side wall of lateral channel layer 131. Source metal 141 has enhanced contact with the side walls of the lateral channel. In one embodiment, source region 191 cut through the side wall of lateral channel layer 131 only. In another embodiment, source 191 cut through side walls of lateral channel layer 131 and further into regrown barrier layer 121.

The overall structure is adopted to optimize the JFET performance. Such structure is achieved with improvement of process.

Figure 2:
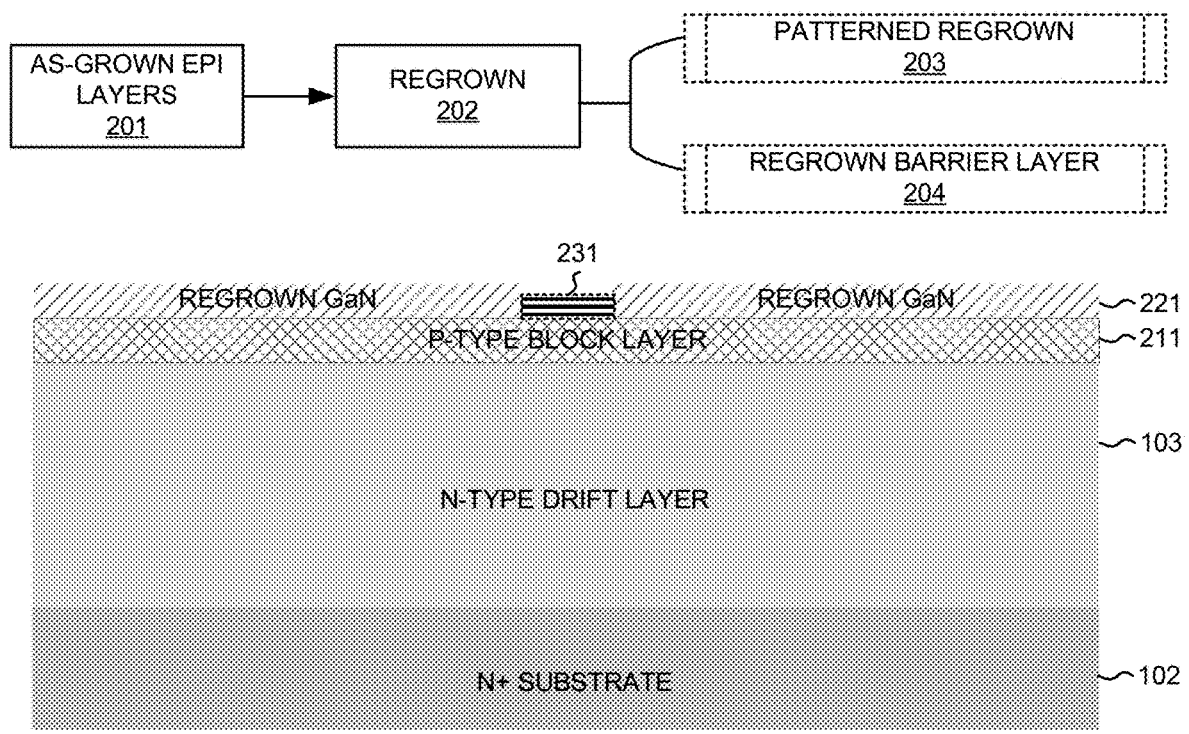
FIG. 2 illustrates exemplary diagrams of a regrown process in accordance with embodiments of the current invention.

FIG. 2 illustrates exemplary diagrams of a regrown process in accordance with embodiments of the current invention. At step 201, EPI layers are created through as-grown process. As shown, substrate 102 has a topside. In one embodiment, substrate 102 is N+ substrate. In one embodiment, substrate 102 has a dimensional height in the range of 50-100 μm thinning. In another embodiment, substrate 102 has a dimensional height in the range of less than 300 μm. An N-type drift layer 103 deposited over substrate 102. In one embodiment, N-type drift layer 103 is an N-type gallium nitride (GaN) drift layer. In one embodiment substrate 102 and drift layer 103 are epitaxially as-grown. Drift layer 103 has a dimensional height in the range of 6-20 μm. In one embodiment, drift layer 103 has a height around 2 μm for possible low voltage punch through devices. In another embodiment, drift layer 103 has a height around 40 μm for high voltage punch through devices. At this step, p-type block layer 211 encapsulate n-type drift layer 103. Subsequently, at step 202, a regrown process is performed to form a lateral channel layer.

In one novel aspect, the regrowth is a patterned regrown 203. An island regrowth mask 231 is deposited over p-type block layer 211. Regrowth mask 231 covers the contact region on top of p-type block layer 211. The contact region covered by regrowth mask 231 is subsequently deposited with contact metal to create improved Ohmic contact with the source. In one embodiment, regrowth mask 231 has a height higher than the first regrown layer. In another embodiment, regrowth mask 231 has a height the same or smaller than the first regrown layer. In one embodiment, regrowth mask 231 is a dielectric layer. A regrown GaN layer 221 is created. In one embodiment, regrown GaN layer is created after the regrown mask 231 is deposited. The regrown GaN layer is created encapsulate the p-type block 211 and surface dopant with a contact gap covered by the regrown mask 231. Subsequently, when regrown mask 231 is removed, the contact gap created by the regrown mask 231 provides an enhanced Ohmic contact with the deposited gate material.

In another novel aspect, a regrown barrier layer is created as step 204. In one embodiment, regrown GaN layer 221 is a barrier layer. In one embodiment, regrown GaN layer 221 is an anti-p-doping layer that blocks the counter doping to the lateral layer and the vertical channel. Regrown layer 221 buries counter doping surface magnesium (Mg) in the regrown layer 221 so the lateral channel is less resistive.

Steps 203 and step 204 are independent improvements that create an overall enhanced JFET. Steps 203 and 204 can be performed individually without one another. Alternatively, steps 203 and 204 are both performed to create a JFET with enhanced Ohmic contact and less resistive lateral channel.

Figure 3:
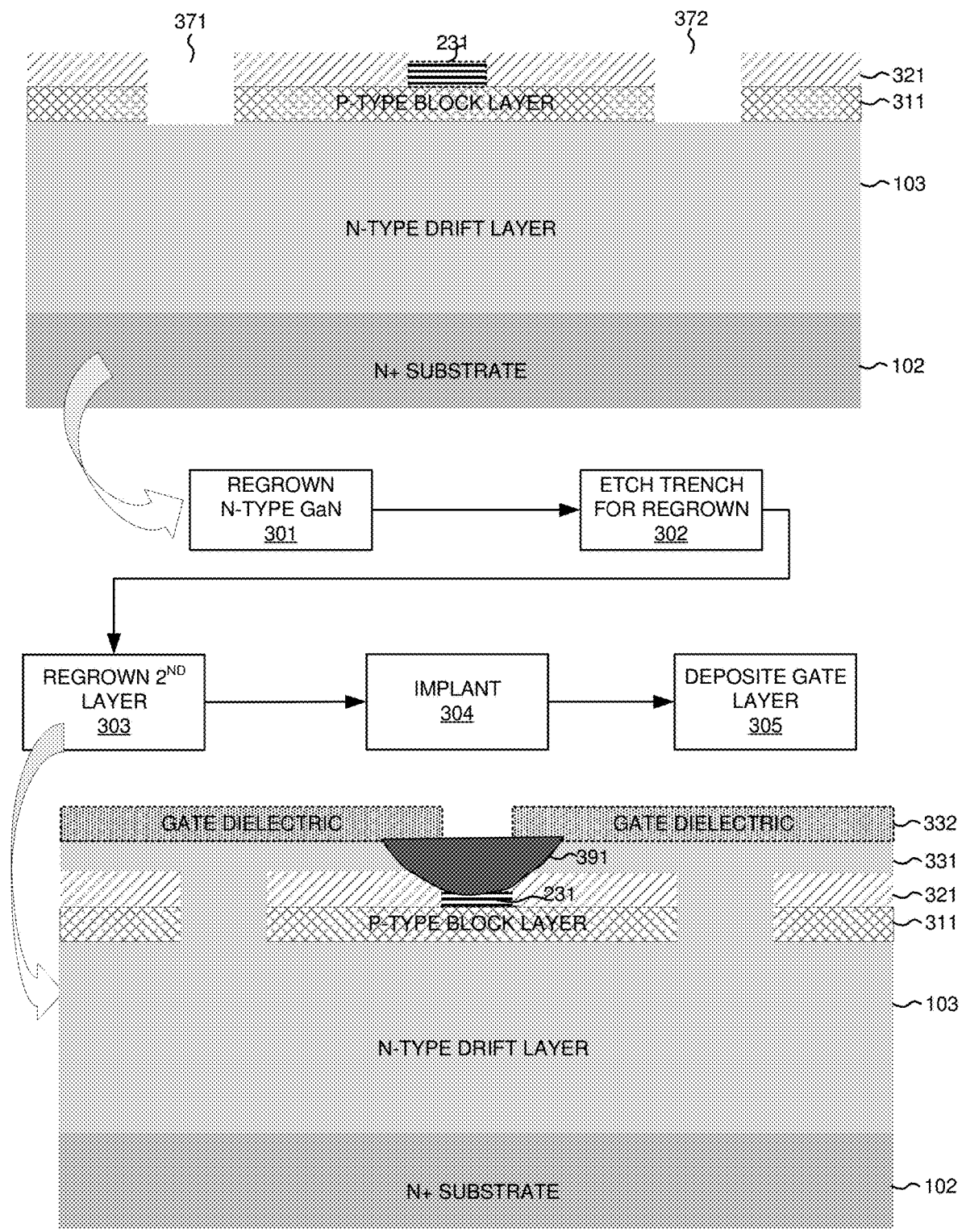
FIG. 3 illustrates exemplary diagrams of forming gate with enhanced Ohmic contact and N+ implant process in accordance with embodiments of the current invention.

FIG. 3 illustrates exemplary diagrams of forming gate with enhanced Ohmic contact and N+ implant process in accordance with embodiments of the current invention. Subsequent to epitaxial as-grown of the substrate layer 102 and the drift layer 103, p-type block layer is grown. In one embodiment, a regrown mask 231 is deposited on top of the drift layer 103 for enhanced Ohmic contact. At step 301, a regrown process deposits N-type GaN on top of the N-type drift layer 103. At step 302, trenches are etched. In one embodiment, where the regrown barrier layer is deposited over the p-type block layer, the trenches 331 and 332 are etched through the regrown layer and through the p-type block layer forming p-type block layer 311 with trenches 371 and 372 and regrown barrier layer 321 with trenches 371 and 372. In another embodiment, trenches are etched through the p-type block layer 103 before the regrowth. In yet another embodiment, the regrown barrier layer is deposited without the regrown mask. Trenches are etched through the regrown layer and through the p-type block layer. In one embodiment, a second regrown layer 331 is deposited over the first regrown layer 321 at step 303. In one embodiment, the second regrown regrows in the trenches 371 and 372 and forms n-type channel, and AlGaN/GaN 2d Gas channel 331. At step 304, a source region 391 in formed by N+ implant to the side walls of lateral channel layer 331. In one embodiment, source region 391 cut through the channel layer 331 only. In another embodiment, source region 391 cut through the channel layer 331 and further into the regrown barrier layer 321. In yet another embodiment where regrown mask 231 is deposited over p-type block layer 311, the bottom of source region 391 contacts the top surface of regrown mask 231. At step 305, gate layer 332 is deposited over the lateral channel layer 331.

Figure 4:
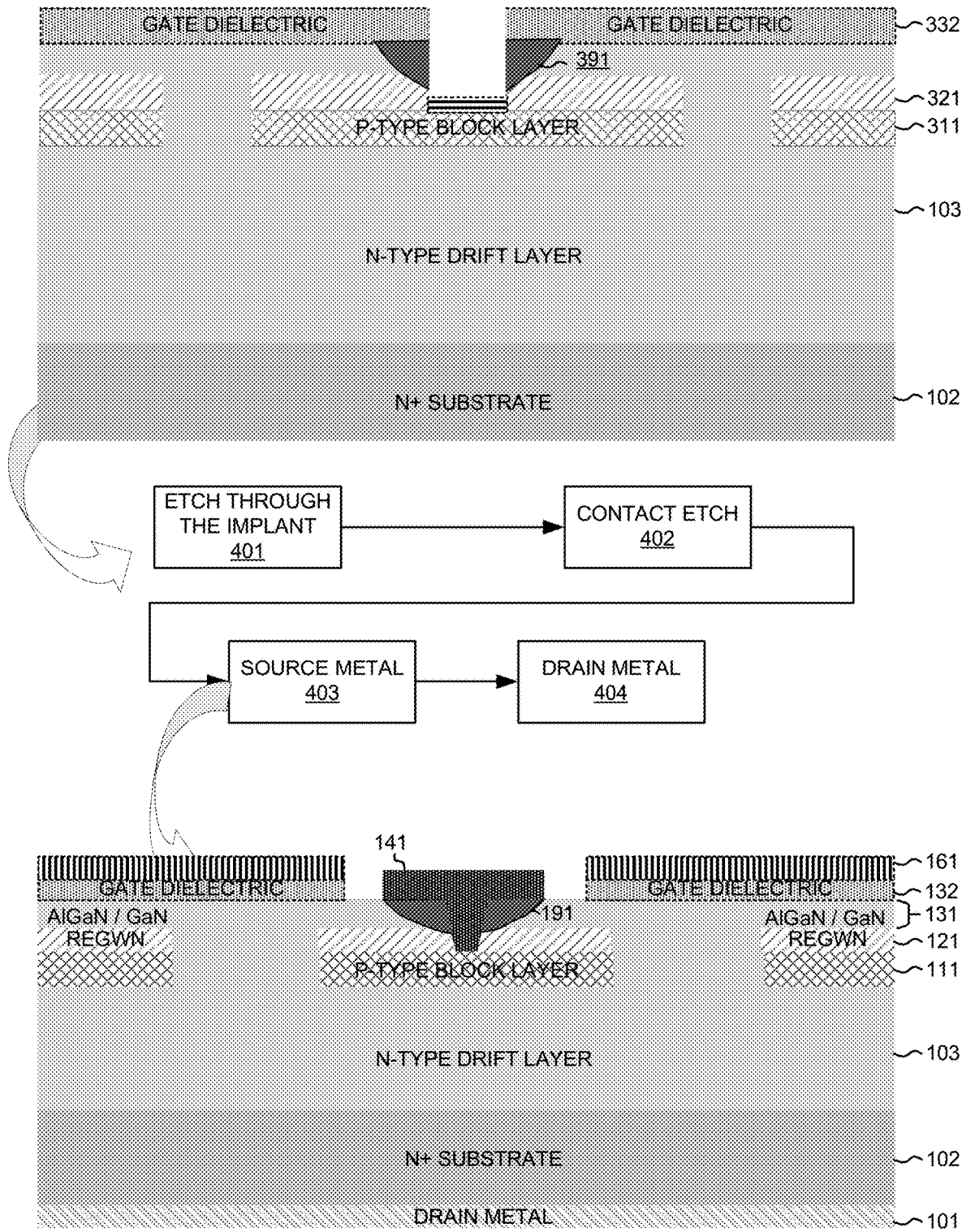
FIG. 4 illustrates exemplary diagrams of forming an enhanced Ohmic contact and source metal in accordance with embodiments of the current invention.

FIG. 4 illustrates exemplary diagrams of forming an enhanced Ohmic contact and source metal in accordance with embodiments of the current invention. In one novel aspect, a source region is created by the side walls of the lateral channel layer. In one embodiment, the source region is created by N+ implant. In another embodiment, the source region is further annealed. At step 401, source region is etched through to create a contact gap. In another novel aspect, a patterned regrowth is used. The contact gap is created by depositing a regrowth mask before the regrowth process and etching the regrowth mask after the regrowth. In one embodiment, the regrowth mask is a dielectric layer. At step 402, the regrowth mask is etched and creating a Ohmic contact with the top surface of the p-type block layer. At step 403, source metal and alloy 141 is deposited over the contact gap and the lateral channel layer. At step 403, drain metal 101 is deposited at the backside substrate 102.

Figure 5:
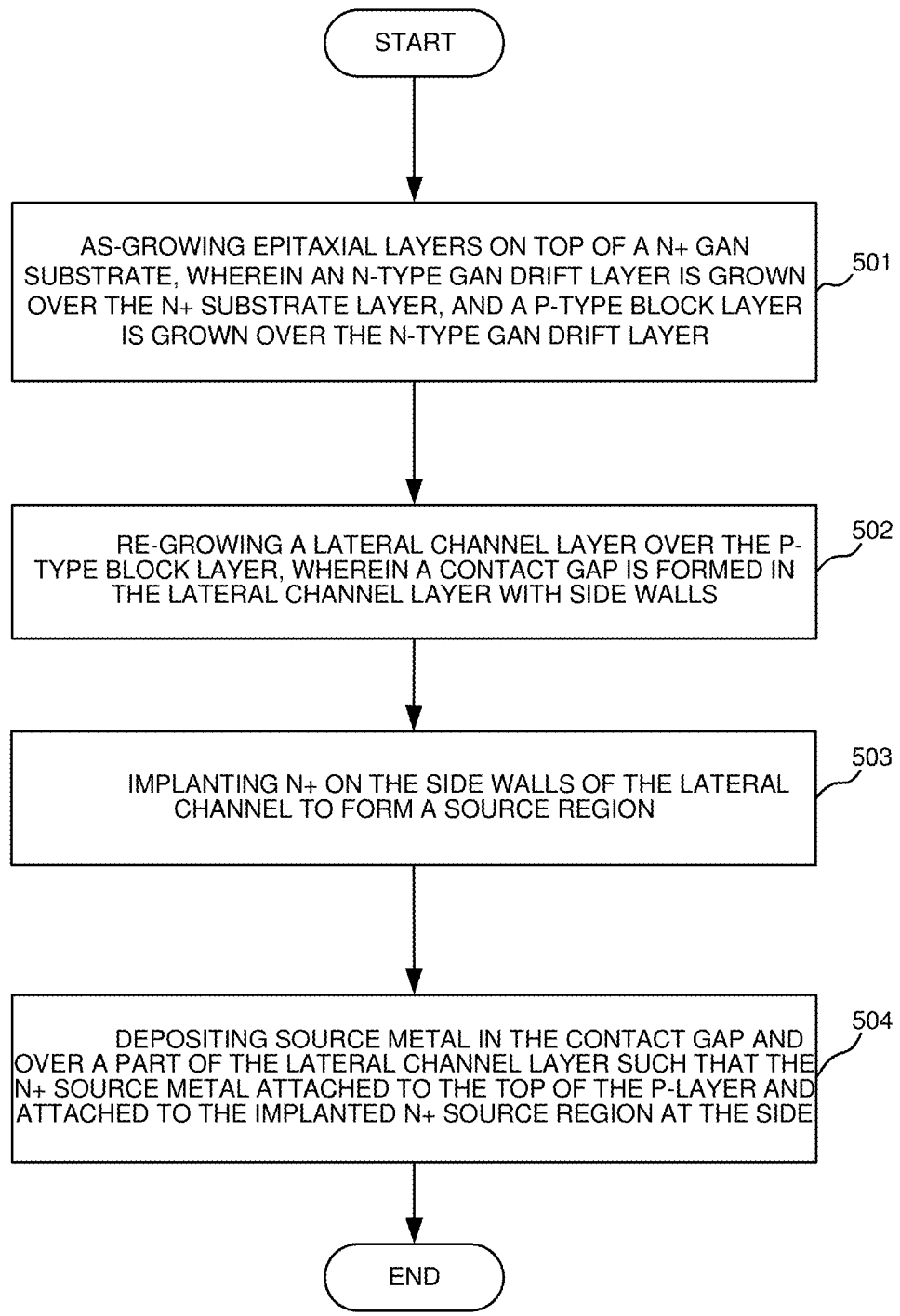
FIG. 5 illustrates an exemplary flow chart of the process with an implant source layer for enhanced lateral channel performance in accordance with embodiments of the current invention.

FIG. 5 illustrates an exemplary flow chart of the process with a barrier regrown layer for enhanced lateral channel performance in accordance with embodiments of the current invention. Step 501 as-grows epitaxial layers on top of a N+ GaN substrate, wherein an N-type GaN drift layer is grown over the N+ substrate layer, and a P-type block layer is grown over the N-type GaN drift layer. Step 502 re-grows a lateral channel layer over the P-type block layer, wherein a contact gap is formed in the lateral channel layer with side walls. Step 503 implants N+ on the side walls of the lateral channel to form a source region. Step 504 deposits source metal in the contact gap and over a part of the lateral channel layer such that the source metal attached to the top of the p-layer and attached to the implanted N+ source region at the side.

Although certain specific embodiments are described above for instructional purposes, the teachings of this patent document have general applicability and are not limited to the specific embodiments described above. Accordingly, various modifications, adaptations, and combinations of various features of the described embodiments can be practiced without departing from the scope of the invention as set forth in the claims.

What is claimed:

1. A method comprising:
   growing as-grown epitaxial layers on top of a N+ GaN substrate, wherein the growing as-grown epitaxial layers comprising growing an N-type GaN drift layer over the N+ GaN substrate layer, and growing a P-type block layer over the N-type GaN drift layer;
   re-growing a lateral channel layer over the P-type block layer;
   forming a contact gap by selective area regrowth during the regrowing the lateral channel layer or etching through the lateral channel after the regrowing;
   implanting N+ in the lateral channel layer to form an implanted N+ source region; and
   depositing source metal in the contact gap and over a part of the lateral channel layer such that the source metal is attached to the P-type block layer and the implanted N+ source region.

2. The method of claim 1, further comprising forming a gate layer over the lateral channel layer.

3. The method of claim 2, wherein the gate layer is a dielectric gate structure that enables a fully enhanced channel.

4. The method of claim 2, wherein the gate layer is a p-type GaN gate structure that enables a partially enhanced channel.

5. The method of claim 1, wherein the re-growing of the lateral channel layer comprises:
   re-growing a first N-type regrown layer over the P-type block layer, wherein the first N-type regrown layer encapsulates the P-type block layer;
   etching trenches through the first N-type regrown layer and the P-type block layer; and
   re-growing a second regrown layer over the first N-type regrown layer and in the trenches to form an N-type channel and a 2D Gas channel.

6. The method of claim 5, wherein the first N-type regrown layer is an anti-p-doping layer.

7. The method of claim 2, wherein the re-growing the lateral channel layer is a patterned regrowth.

8. The method of claim 7, wherein the patterned regrowth is performed by depositing a dielectric layer over a part of the P-type block layer before re-growing the lateral channel layer.

* * * * *